US012785646B2

(12) United States Patent
Ye et al.

(10) Patent No.: US 12,785,646 B2
(45) Date of Patent: Nov. 3, 2026

(54) APPARATUSES AND METHODS INVOLVING FREQUENCY-TUNING MATCHING NETWORK

(71) Applicant: The Board of Trustees of the Leland Stanford Junior University, Stanford, CA (US)

(72) Inventors: Zhechi Ye, Stanford, CA (US); Juan Rivas-Davila, Palo Alto, CA (US)

(73) Assignee: The Board of Trustees of The Leland Stanford Junior University, Stanford, CA (US)

( * ) Notice: Subject to any disclaimer, the term of this patent is extended or adjusted under 35 U.S.C. 154(b) by 113 days.

(21) Appl. No.: 18/747,897

(22) Filed: Jun. 19, 2024

(65) Prior Publication Data

US 2024/0421792 A1 Dec. 19, 2024

Related U.S. Application Data

(60) Provisional application No. 63/521,838, filed on Jun. 19, 2023.

(51) Int. Cl.
*H03H 7/38* (2006.01)
*H05H 1/46* (2006.01)
(Continued)

(52) U.S. Cl.
CPC ............ *H03H 7/38* (2013.01); *H05H 1/4652* (2021.05); *H02M 3/335* (2013.01); *H03F 3/2176* (2013.01)

(58) Field of Classification Search
CPC .......... H03H 7/38; H03H 7/40; H05H 1/4652; H02M 3/335; H03F 3/2176
See application file for complete search history.

(56) References Cited

U.S. PATENT DOCUMENTS

| | | | | |
|---|---|---|---|---|
| 6,303,166 B1 * | 10/2001 | Kolbe | ...................... | A23B 4/01 219/771 |
| 11,057,020 B1 * | 7/2021 | Graceffo | .................. | H03F 3/19 |
| 2020/0066489 A1 * | 2/2020 | Lozic | ................ | H01J 37/32183 |

OTHER PUBLICATIONS

Z. Ye, K. Surakitbovorn, C. Lin, and J. Rivas-Davila, "Frequency-tuning matching network for load-varying applications," in Proc. IEEE Appl. Power Electron. Conf. Expo., Feb. 2024, pp. 1604-1607.

(Continued)

*Primary Examiner* — G.M. A Hyder
(74) *Attorney, Agent, or Firm* — Mueting Raasch Group

(57) ABSTRACT

In certain examples, methods and semiconductor structures involve use of or are directed to a circuit-based apparatus comprising a matching network, including a variable-resistance-matching network, to impedance match a variable load impedance with a fixed source impedance in response to one or more frequencies being varied in a signal of an amplification or source circuit that provides the fixed source impedance. Optionally, the matching network includes: load circuitry to manifest the variable load impedance; and/or a reactance-neutralization network, with the variable-resistance-matching network and the reactance-neutralization network being cooperatively configured to provide impedance matching, between the amplification or source circuit and the load circuitry (e.g., without relying on operation of adjustable passive components or of semiconductor switches).

20 Claims, 9 Drawing Sheets

(51) Int. Cl.
*H02M 3/335* (2006.01)
*H03F 3/217* (2006.01)

(56) References Cited

OTHER PUBLICATIONS

Ye, Zhechi, and Juan Rivas. "Broadband High Frequency Power Conversion With Frequency-Tuning Matching Network." IEEE Open Journal of Power Electronics (2024).
Patrick, Roger, et al. "Characterization of an aluminum etching process in an inductively coupled discharge using measurements of discharge impedance and current and voltage sensors." Journal of Vacuum Science & Technology A: Vacuum, Surfaces, and Films 15.3 (1997): 1250-1256. (Abstract Only).
Braun, Weston D., and David J. Perreault. "A high-frequency inverter for variable-load operation." IEEE Journal of Emerging and Selected Topics in Power Electronics 7.2 (2019): 706-721.
Sánchez-Pérez, César, et al. "Design and applications of a 300-800 MHz tunable matching network." IEEE Journal on Emerging and Selected Topics in Circuits and Systems 3.4 (2013): 531-540. (Abstract Only).
Sohn, Sung Min, John Thomas Vaughan, and Anand Gopinath. "Auto-tuning of the RF transmission line coil for high-fields magnetic resonance imaging (MRI) systems." 2011 IEEE MTT-S International Microwave Symposium, IMS 2011. 2011. (Abstract Only).
Jurkov, Alexander S., Aaron Radomski, and David J. Perreault. "Tunable matching networks based on phase-switched impedance modulation." IEEE Transactions on Power Electronics 35.10 (2020): 10150-10167.
Chung, Euihoon, et al. "Impedance compressing matching network based on two-port network analysis for wireless power transfer system." IEEE Journal of Emerging and Selected Topics in Industrial Electronics 3.3 (2021): 432-442.
Sinha, Sreyam, et al. "Active variable reactance rectifier—A new approach to compensating for coupling variations in wireless power transfer systems." IEEE Journal of Emerging and Selected Topics in Power Electronics 8.3 (2019): 2022-2040.
Han, Yehui, et al. "Resistance compression networks for radio-frequency power conversion." IEEE Transactions on Power Electronics 22.1 (2007): 41-53.
Al Bastami, Anas, et al. "Dynamic matching system for radio-frequency plasma generation." IEEE Transactions on Power Electronics 33.3 (2017): 1940-1951.
Zan, Xin, Khandoker N. Rafa Islam, and David J. Perreault. "Wide-range switched-mode power amplifier architecture." 2023 IEEE 24th Workshop on Control and Modeling for Power Electronics (COMPEL). IEEE, 2023. (Abstract Only).
Roslaniec, Lukasz, et al. "Design of Single-Switch Inverters for Variable Resistance/Load Modulation Operation." IEEE Transactions on Power Electronics 30.6 (2015): 3200-3214.
Aldhaher, Samer, David C. Yates, and Paul D. Mitcheson. "Load-Independent Class E/EF Inverters and Rectifiers for MHz-Switching Applications."
Xu, Jiale, et al. "Frequency-selective mhz power amplifier for dielectric barrier discharge plasma generation." IEEE open journal of power electronics 3 (2022): 846-855.
Hamill, David C. "Class DE inverters and rectifiers for DC-DC conversion." PESC Record. 27th Annual IEEE Power Electronics Specialists Conference. vol. 1. IEEE, 1996. (Abstract Only).
Gu, Lei, et al. "Push-Pull Class ϕ2 RF Power Amplifier." IEEE Transactions on Power Electronics 35.10 (2020): 10515.
Zulinski, Robert E., and Kevin J. Grady. "Load-independent class E power inverters. I. Theoretical development." IEEE Transactions on Circuits and Systems 37.8 (1990): 1010-1018. (Abstract Only).
Aldhaher, Samer, David C. Yates, and Paul D. Mitcheson. "Modeling and analysis of class EF and class E/F inverters with series-tuned resonant networks." IEEE transactions on power electronics 31.5 (2015): 3415-3430.
Tong, Zikang, Lei Gu, and Juan Rivas-Davila. "Wideband PPT Class $\Phi _2 $ Inverter Using Phase-Switched Impedance Modulation and Reactance Compensation." IEEE Transactions on Industrial Electronics 69.6 (2021): 5724-5734.
Bohn, Florian, Scott Kee, and Ali Hajimiri. "Demonstration of a switchless Class E/F/sub odd/dual-band power amplifier." 2002 IEEE MTT-S International Microwave Symposium Digest (Cat. No. 02CH37278). vol. 3. IEEE, 2002.
Chen, Sida, and Lei Gu. "A Wideband Push-Pull ϕ2 Amplifier with PCB Inductors and Rogowski Coils for RF Plasma Generators." 2024 IEEE Workshop on Control and Modeling for Power Electronics (COMPEL). IEEE, 2024. (Abstract Only).
Komanaka, Ayano, et al. "Generalized analysis of load-independent ZCS parallel-resonant inverter." IEEE Transactions on Industrial Electronics 69.1 (2021): 347-356. (Abstract Only).
Ye, Zhechi, et al. "A high frequency resonant gate driver for SiC MOSFETs." 2021 IEEE 22nd Workshop on Control and Modelling of Power Electronics (COMPEL). IEEE, 2021. (Abstract Only).
Xu, Jiale, et al. "Cascode GaN/SiC: A wide-bandgap heterogenous power device for high-frequency applications." IEEE Transactions on Power Electronics 35.6 (2019): 6340-6349.

* cited by examiner

APPARATUSES AND METHODS INVOLVING FREQUENCY-TUNING MATCHING NETWORK

BACKGROUND

Aspects of the present disclosure are related generally to the field of circuit-related matching networks which may be applied to a variety of applications.

Using one such application and technology type for ease of discussion, it has been appreciated that an efficient radio frequency (RF) power amplifier (PA) is critical to various industrial applications, such as plasma generation, wireless power transfer, communication, and magnetic resonance imaging. In general, it is difficult for PAs to maintain high efficiency over a broad load range while providing the desired power gain. However, many of these applications present a varying load impedance that can deviate significantly from nominal values, which may lead to efficiency deterioration or even damage to the system. Therefore, tunable matching networks are often necessary to provide dynamic and flexible impedance conversion between PAs and loads, ensuring efficient power delivery. Conventional tunable matching networks are implemented with adjustable passive components. Although they conceptually provide perfect matching across a broad load range, the systems tend to be bulky with a slow transient response as components are adjusted by motors. More recently proposed tunable matching networks consist of only fixed passive components and active semiconductor switches. With static switches replacing rotating motors, these matching networks are inherently more compact and display faster transient responses. However, they require precisely adjusted signals to control the semiconductor switches, adding extra complexity and cost to the system. Further, such matching networks inevitably suffer from losses in the semiconductor devices due to non-zero on resistance and switching losses. Given that semiconductor switches tend to be less robust than passive components, the system may also require additional effort to ensure reliability.

Accordingly, there are needs to develop methods and circuit-based apparatuses to address the above, and other issues.

SUMMARY OF VARIOUS ASPECTS AND EXAMPLES

Various examples/embodiments presented by the present disclosure are directed to issues such as those addressed above and/or others which may become apparent from the following disclosure. For example, some of these disclosed aspects are directed to methods and devices that use or leverage from an adjustment of a frequency in a signal generated (or derived) from a source to cause a variable load impedance to be impedance matched with a fixed source impedance. Other aspects are directed to overcoming previously-used techniques, such as discussed above, through the use of a variable-resistance-matching network cooperatively operating, in response to such a frequency-signal adjustment, with a reactance-neutralization network.

In one specific example, a method comprises matching a varying load impedance associated with a load to a fixed source impedance associated with a source (e.g., an amplifier and/or a voltage source generating an oscillating signal), by adjusting at least one frequency of a signal derived from an output port of the source.

Various more-particular examples may employ this method along with one or any combination of the following aspects: adjusting the at least one frequency of the signal derived from an output port of the source while using circuitry to counteract neutralize reactance of the load; performing the matching at least in part via wide-range resistance-matching circuitry that is to match a resistance, that can vary over a wide range, to the fixed source impedance, via reactance-neutralization circuitry to neutralize or mitigate reactance associated with the load; and/or via resistance-matching circuitry that is to match a variable resistance, to the fixed source impedance and via reactance-neutralization circuitry, which is cooperatively configured with the resistance-matching circuitry, to neutralize or mitigate reactance associated with the load; adjusting the at least one frequency via a frequency-sweep circuit or a frequency-selection circuit within a range of possible frequencies including lower and upper frequencies and also including a plurality of intermediate frequencies between the lower and upper frequencies; and with the matching provided through a matching circuit network that does not rely on switching semiconductors characterized as manifesting losses in the switching semiconductors due to non-zero on resistance and switching losses and/or on adjustable passive components.

In certain examples, methods and semiconductor structures involve use of or are directed to a circuit-based apparatus (e.g., as a system, device and/or circuitry) comprising a matching network, including a variable-resistance-matching network, to impedance match a variable load impedance with a fixed source impedance in response to one or more frequencies being varied in a signal of an amplification or source circuit that provides the fixed source impedance. Optionally, the matching network includes: load circuitry to manifest the variable load impedance; and/or a reactance-neutralization network, with the variable-resistance-matching network and the reactance-neutralization network being cooperatively configured to provide impedance matching, between the amplification or source circuit and the load circuitry (e.g., without relying on operation of adjustable passive components or of semiconductor switches).

In certain other examples which may also build on the above-discussed aspects, methods and semiconductor structures are directed to the matching being provided through a matching circuit network that includes a frequency-tuning circuit to transform a varying resistance into a near-constant driving point resistance by adjusting the at least one frequency.

In other more specific examples related to the above methodology and/or system-type apparatus, the apparatus may include at least one of wireless-power-transfer circuit and a plasma generator.

According to another related aspect, the matching is performed by a matching network that includes a wide-range resistance-matching network to match different load resistances to source resistances that are within twenty or thirty percent of a nominal value Rs, wherein Rs represents resistive source impedance of the amplification circuit.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description in connection with the accompanying drawings, each in accordance with the present disclosure, in which.

Figure 1:
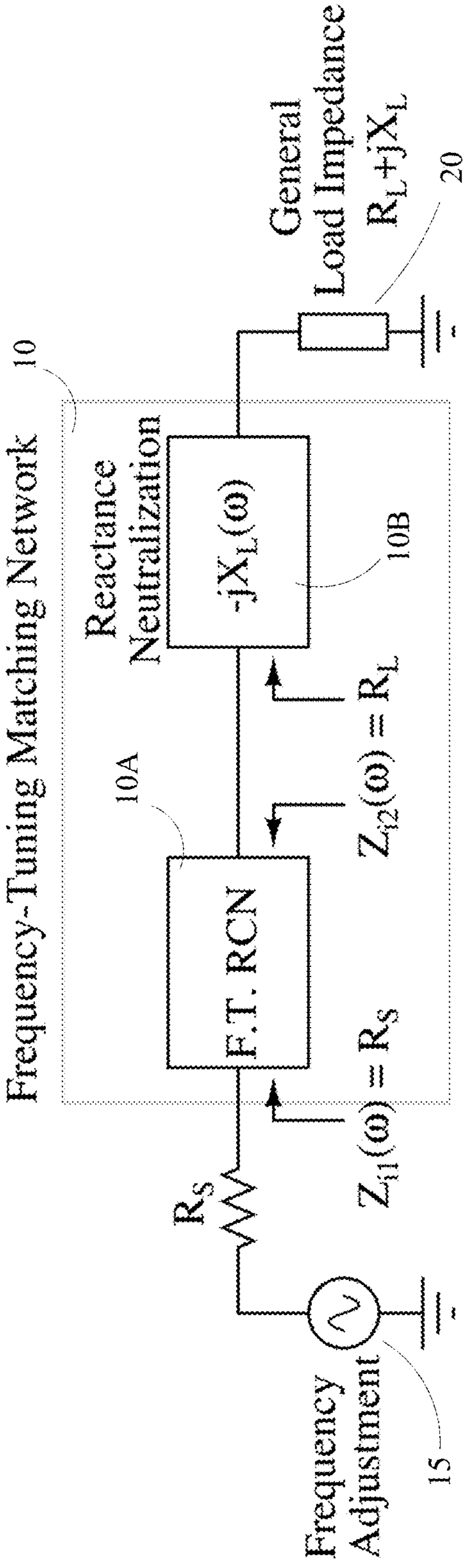
FIG. 1 is a frequency-tuning matching network, according to certain exemplary aspects of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving devices characterized at least in part by a matching network's response to an adjustment of a frequency in a signal generated (or derived) from a source to cause a variable load impedance to be impedance matched with a fixed impedance at the source. While the present disclosure is not necessarily limited to such aspects, an understanding of specific examples in the following description may be understood from discussion in such specific contexts.

In a specific example according to the present disclosure, a method includes matching a varying load impedance associated with a load to a fixed source impedance associated with a source by adjusting at least one frequency of a signal derived from an output port of the source. The source may be an amplifier and/or a voltage (power) source that generates an oscillating output signal.

In other specific implementations, such matching involves use of a matching network that includes a variable-resistance matching network and a reactance neutralization network. These networks are cooperatively configured to provide a solution to design matching networks for varying loads without adjustable passive components or semiconductor switches, and can be useful for a variety of applications such as plasma generators or wireless power transfer.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For case of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In certain specific matching-network applications, examples of the present disclosure are directed to methods and apparatuses (e.g., systems, circuits, assemblies, devices, one or more integrated circuits (ICs), etc.) involving multi-port (e.g., two-port) matching networks that can match a varying load impedance to a fixed source impedance by adjusting the frequency. Certain conventional tunable matching networks are implemented with adjustable passive components. Although they conceptually provide perfect matching across a broad load range, the systems tend to be bulky with a slow transient response as components are adjusted by motors. More recently proposed tunable matching networks consist of only fixed passive components and active semiconductor switches. With static switches replacing rotating motors, these matching networks are inherently more compact and display faster transient responses. However, it requires precisely adjusted signals to control the semiconductor switches, adding extra complexity and cost to the system. Given that semiconductor switches tend to be less robust than passive components, the system may also require additional effort to ensure reliability. In contrast to such conventional tunable matching networks, exemplary matching networks according to the present disclosure may be implemented to: be compact and fast; be manufactured for low-cost; and have relatively a simple architecture and with easy control approaches, and no requirements of motors and/or switches.

Accordingly, exemplary aspects of the present disclosure are directed to an apparatus including, or using, a frequency-tuning matching network such as depicted in the circuit-based block diagram of FIG. 1. More particularly, FIG. 1 shows a frequency-tuning or frequency-tunable matching network 10 configured to impedance match a source 15 to a load 20. By adjusting (or tuning) the frequency of a signal generated or derived from the source 15, the impedance matching is effected. In particular examples, the source 15 may manifest a fixed impedance ("fixed-source impedance") and the load 20 may manifest a variable impedance ("varying-load impedance"). By adjusting at least one frequency of a signal derived from an output port of the source, a varying load impedance associated with the load 20 is impedance matched to a fixed impedance associated with the source 15.

In more-specific examples, the matching network 10 (or sometimes frequency-tuning matching network, "FTMN") includes one or both of a variable-resistance-matching network 10A and a reactance-neutralization network 10B. When both the variable-resistance-matching and reactance-neutralization networks 10A and 10B are used, the networks are cooperatively configured to provide impedance matching between the source (and/or amplification circuitry) and the load, and this may be realized without relying on operation of adjustable passive components or of semiconductor switches.

Building on the above discussion and examples, in more-specific examples involving use of a variable-resistance-matching network 10A and a reactance-neutralization network 10B, the FTMN 10 may include a wide-range resistance compression network (RCN) as the variable-resistance-matching network 10A and the reactance-neutralization network 10B may be used only selectively depending on whether the varying impedance of the load would cause sufficient reactance in the FTMN 10 to require (e.g., as may be indicated in the circuit specifications for a particular type of load) reactance neutralization to counter (or mitigate) such reactance. In a specifically-designed example, the FTMN 10 may be part of a power amplifier that includes in addition to the FTMN 10, a broadband switch-mode power stage which implements the source 15 via a power amplification circuit (or power amplifier), and the variable-resistance-matching network 10A as a wide-range resistance compression network (RCN) and the cooperatively-operable reactance neutralization network (RNN) 10B. Again, this type of design and/or technique provides a solution to design power amplifiers for varying loads without adjustable passive components or semiconductor switches.

The RNN 10B uses an opposite reactance to cancel out the non-resistive part of the load impedance by adjusting frequency. The RCN then matches the remaining varying resistive part to a near constant source impedance, ensuring the power amplifier operating at its optimum efficiency. The FTMN is designed by shaping the frequency characteristics of image impedances of the two-port network. The source side image impedance is designed near-constant (e.g., 5%-10% linear over 1 MHZ) over the frequency range, while the load side has some certain slope to achieve reactance neutralization.

In specific experimentation of the above type of matching network, the frequency-tuning RCN transforms a wide-range varying resistance into a near-constant driving point resistance by adjusting the frequency, and the RNN cancels out the varying load reactance in synchronous with the RCN, ensuring the RCN drives a near-resistive impedance.

For a better understanding of different types of implementations for the FTMN 10, a background discussion of impedance modeling is helpful.

Figure 2A:
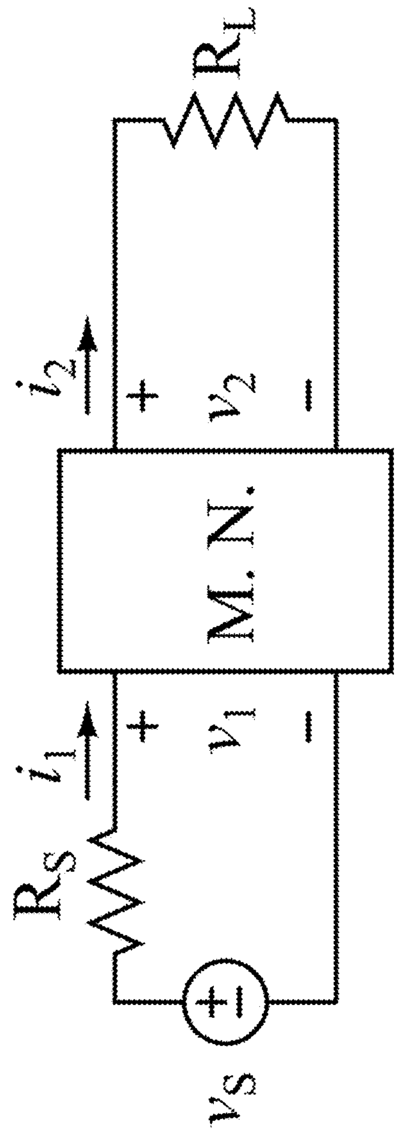
FIGS. 2A, 2B and 2C are respectively a typical matching network structure, according to certain exemplary aspects of the present disclosure.

A general structure of impedance matching system can be drawn as in FIG. 2A, where the matching network is represented as a two-port network. In this example, only resistive source and load impedances, RS and RL, are respectively considered. It is assumed that the matching network is an ideal LC network that consists of lossless passive components. The system is driven by a sinusoidal source voltage $v_S$, of which the amplitude is $V_S$ and the angular frequency is ω. The power transmission coefficient of the system is defined as the square root of the ratio between the power delivered to the load and the power available from the source, which can be expressed as $$Tp = 2V_L / V_s\sqrt{(R_s/R_L)}, \tag{1}$$

where VL is the voltage amplitude across the load. Tp is a measure of how well the impedance is matched in the system: a perfect matching results in Tp=1, while in other cases Tp is less than 1. Considered next is the scenario that $R_S$ is fixed while $R_L$ can vary across some range. This is a practical situation when a switched-mode power amplifier is implemented to drive a variable load. Such a power amplifier generally requires a near-constant loading to maintain high efficiency and safe operating. Hence, a matching network needs to be implemented between the amplifier and the load to provide a near-constant driving point impedance. Equivalently, the power amplifier can be modeled as a Thevenin source as in FIG. 2A, which uses a fixed driving point impedance to deliver maximum power. Consistent with the above, aspects of the present disclosure are directed to designing matching networks that are able to match a varying load resistance RL to a near-constant source resistance RS by adjusting the frequency. To this end, a nominal load resistance $R_{L0}$ and a nominal frequency $\omega_0$ are chosen. The matching network is designed to perfectly match $R_{L0}$ to $R_S$ at $\omega_0$, which is equivalent to $$Z_{i1}(\omega_0) = R_S, \quad Z_{i2}(\omega_0) = R_{L0}, \tag{2}$$

where $Z_{i1}$ and $Z_{i2}$ are the image impedances of port 1 and 2 (as defined in FIG. 2A), respectively. Then the image impedance of port 1 can remain near-constant across frequency, while allowing the image impedance of port 2 to change significantly, which uses that $$dZ_{i1}(\omega_0)/d\omega = 0, \quad \text{and} \quad dZ_{i2}(\omega_0)/d\omega \neq 0. \tag{3}$$

By doing so, at different frequencies, the matching network matches different load resistances to source resistances that are very close to the nominal value $R_S$.

Figure 2B:
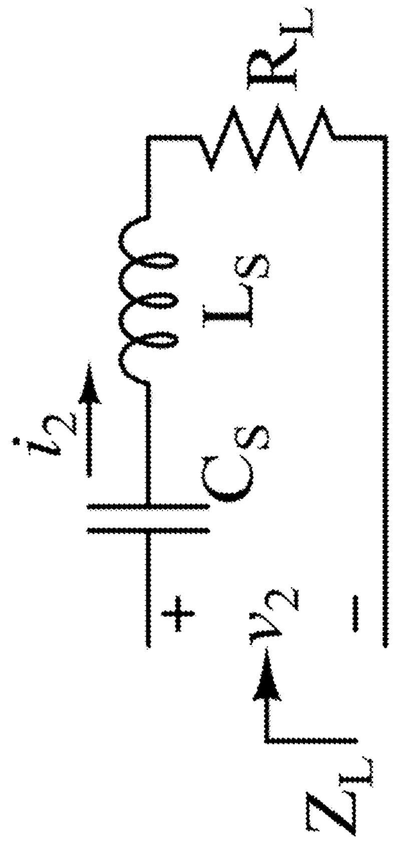

For neutralizing reactance in accordance with specific aspects of the present disclosure, situations can be considered in which a varying complex load impedance is to be matched. FIG. 2B may be referred to in this regard as this figure shows a circuit with a complex load impedance and with an added capacitor. If the load reactance remains constant and only the load resistance varies, the same types of matching networks as described in the above discussion can be implemented, as long as the load reactance is considered as part of the matching network.

For varying reactance and resistance according to another specific approach consistent with the present disclosure, a reactance neutralization technique is provided to help counteract the variation of reactance so that the remaining varying resistance can be matched with the FTMN as exemplified above. To illustrate the reactance neutralization technique, consider the example as shown in FIG. 2B, where $L_S$ and $R_L$ represent the load impedance to be matched. Their relationship may be approximated as a linear function $$L_S = L_{S0} + dL_S(R_{L0})(R_L - R_{L0})/dR_L \tag{4}$$

where $L_{S0}$ is the nominal inductance at $\omega_0$. As in FIG. 2B, a fixed capacitance CS is added to cancel out the reactance at $\omega_0$ as $$C_S = 1/\omega^2{}_0 L_{S0} \tag{5}$$

The overall reactance including the neutralization capacitor at different frequencies can be expressed as $$X_L = \omega L_S - 1/\omega C_S. \tag{6}$$

To minimize the change of overall reactance with frequency and maintain its near-zero value around $\omega_0$, the following relationship is considered $$dXL(\omega_0)/d\omega = 2LS0 + \omega_0[dLS(RL0)/dRL] \times [dRL(\omega 0)/d\omega] = 0 \tag{7}$$

Assuming the matching network image impedance $Z_{i2}$ tracks $R_L$, the required $Z_{i2}$ slope can be solved for the condition as:

$$d\ Z_{i2}(\omega_0)/d\omega = -2L_{S0/\omega 0}(dL_S(R_{L0})/dR_L) - 1. \tag{8}$$

As a result, adding expression (8) to expressions (2) and (3) renders a matching network that neutralizes the load reactance while maintaining effective impedance matching.

Figure 2C:
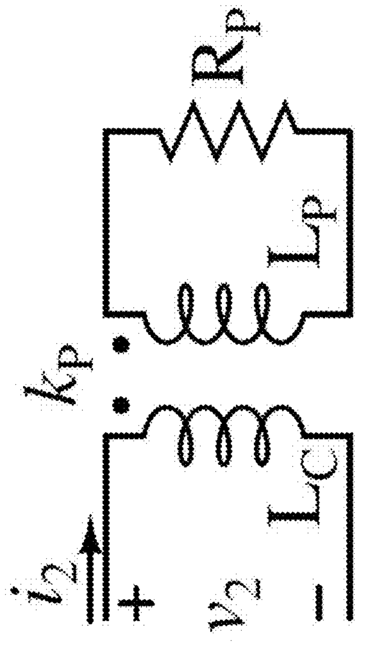

In view of the above relationships and according to certain exemplary aspects of the present disclosure, various matching-network design examples may be implemented by matching a varying load impedance associated with a load to a fixed source impedance associated with a source, by adjusting at least one frequency of a signal derived from an output port of the source. As one such example according to the present disclosure, a matching-network design involves a plasma load that is by nature a varying complex impedance. FIG. 2C is a previously-known impedance model that fits the electrical characteristics of plasma loads. In this model, $L_C$ represents the physical coil that drives the plasma and remains unchanged, while $k_P$, $L_P$ and $R_P$ all depend on the status of plasma and can vary at different power levels. The overall load impedance $R_L+j\omega L_S$ is thus the input impedance of this LR network. Based on the experimental data provided in the impedance model for $Cl_2$ plasma at 30 mT pressure, this exemplary design approach may be used to design a matching network that matches this plasma load to a source impedance of, in this specific example, 50Ω.

Figure 3A:
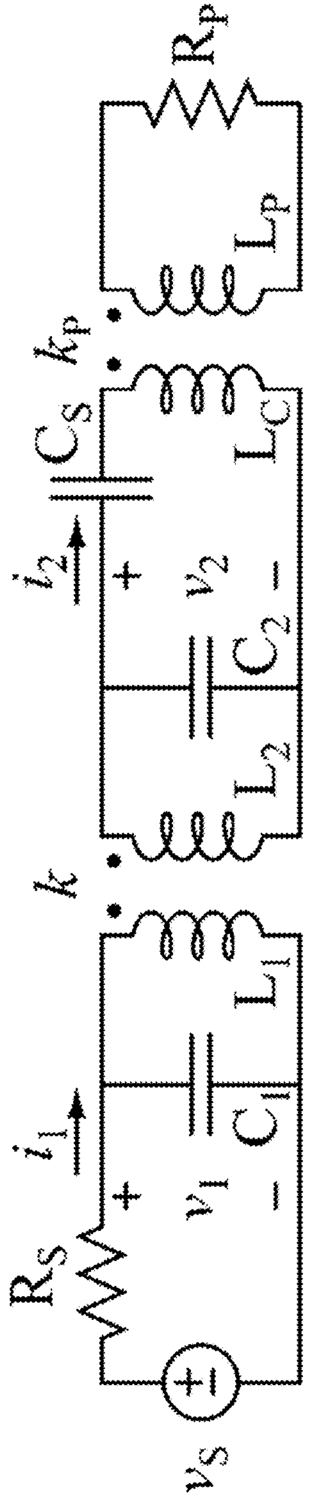
FIG. 3A is a matching network with plasma load.

FIG. 3A is a schematic of an example design of the present disclosure, where $L_1$, $L_2$, $C_1$, $C_2$ and $C_S$ represents the FTMN to be designed. The nominal frequency chosen here is $\omega_0$=13.56 MHz, the nominal load inductance $L_{S0}$=4.54 pH, and the nominal load resistance $R_{L0}$=10Ω. By regression, it may be assumed that $dL_S$ $(R_{L0})$ $dR_L$=−70 nH/Ω, to linearize the plasma load inductance. According to the above expression (5), $C_S$ is set equal to 30 pF for reactance neutralization, and the remaining $L_1$, $L_2$, $C_1$ and $C_2$ components act as a wide-range resistance matching network (e.g., depending on the specific application and load, wide-range may refer to a resistance range that is variable from a few Ohms up to several Ohms, from several Ohms to two-dozen Ohms, from a few Ohms up to two-dozen Ohms, or to another more extreme range). To design the wide range resistance matching network, its images impedance can be readily derived as a function of a coupling coefficient k. A practical coupling coefficient k=0.707 may be (arbitrarily) chosen to reduce the degree of freedom and solve for network parameters. By plugging numbers into the above expressions (2), (3) and (8), the following network parameters are solved as $L_1$=428 nH, $C_1$=405 pF, $L_2$=789 nH, and $C_2$=110 pF.

Figure 3B:
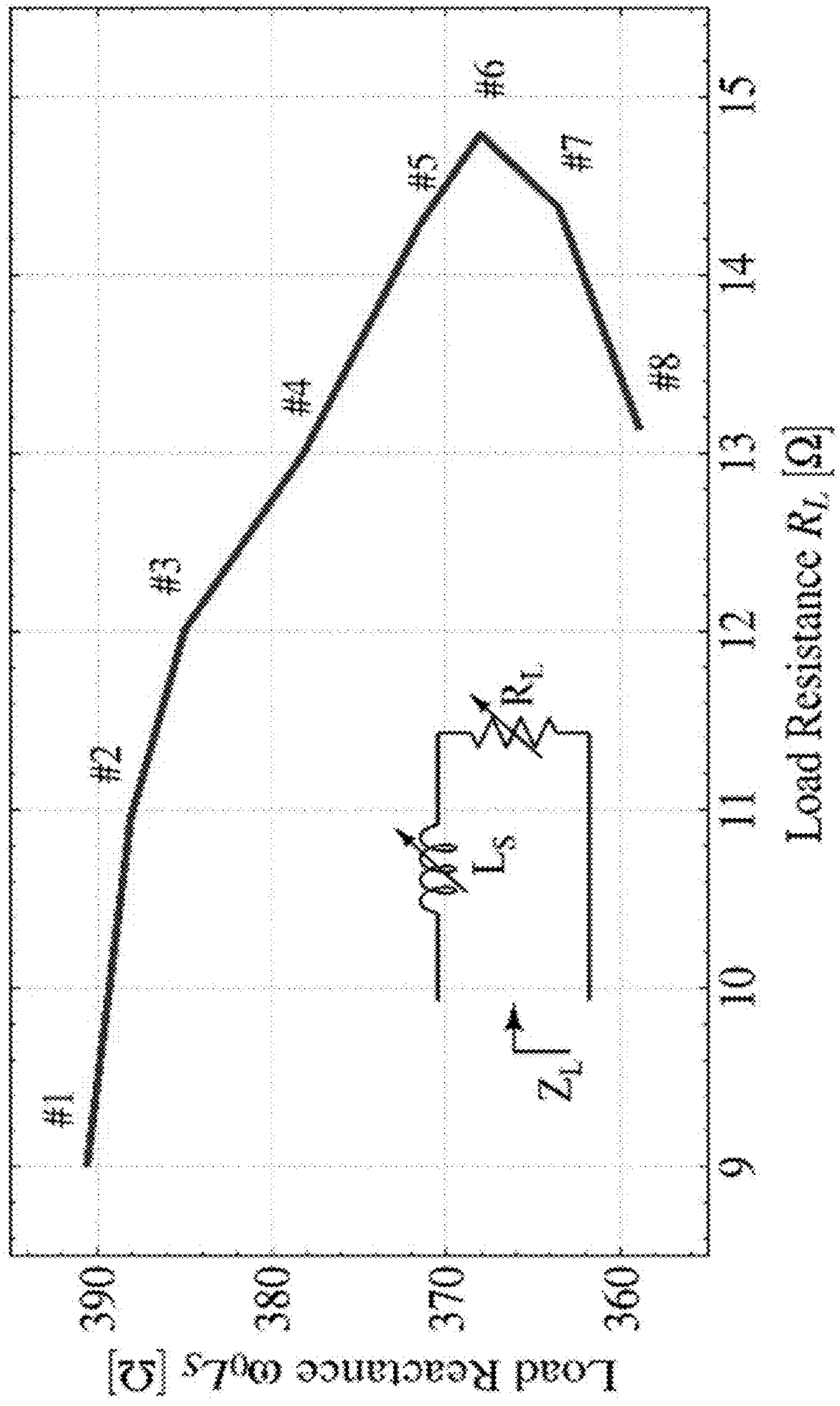
FIG. 3B is a corresponding graph showing load reactance versus load resistance, according to certain exemplary aspects of the present disclosure.

To illustrate the performance of the designed matching network, the circuit may be experimentally implemented with a variable RI dummy load representing plasma impedance. By adjusting the dummy load, we are able to achieve a varying impedance as shown in FIG. 3B.

Figure 4:
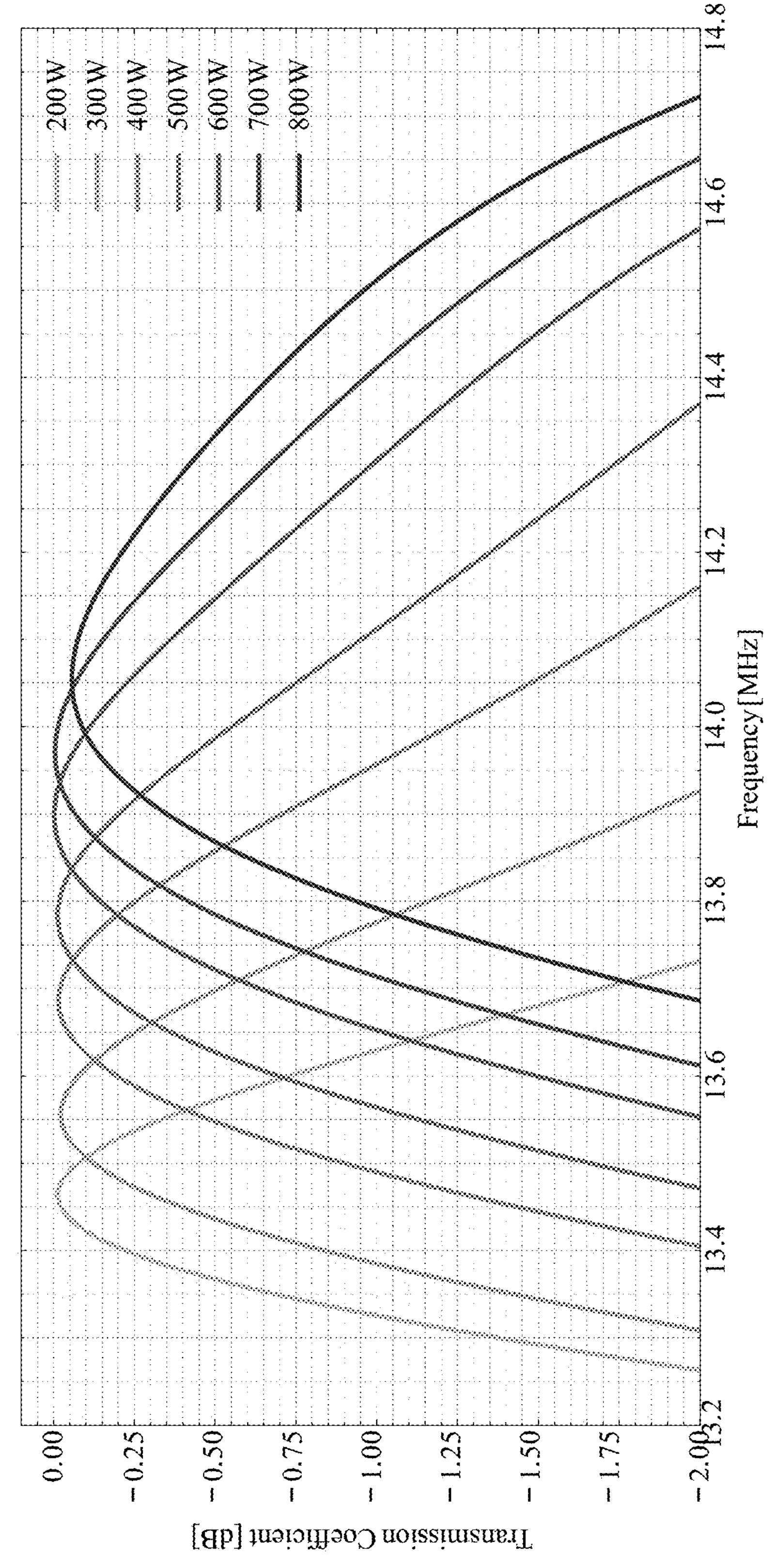
FIG. 4 is a graph of a transmission coefficient with plasma load, according to certain exemplary aspects of the present disclosure.

The performance of designed matching network can be further illustrated by showing the system transmission coefficients as plotted versus frequency at different power levels. Such a graph of transmission coefficients with plasma load is shown in FIG. 4, according to certain exemplary aspects of the present disclosure, with each arc from left to right corresponding to the different power levels, respectively from top to bottom. As indicated by the graph, it is possible to achieve near-zero transmission coefficients for the plasma load at all power levels by adjusting the frequency.

Accordingly, the exemplary designs and methods of the present disclosure provide for a varying load reactance being matched to a fixed source resistance with frequency adjustment. As may be recognized from the foregoing discussion, any of a variety of circuit-based apparatuses (e.g., systems including a plasma generator, wireless-signal generator and/or charging system such as for an electric vehicle), with such matching-network circuitry can include a variable-resistance-matching network to impedance match a variable load impedance with a fixed source impedance in response to one or more frequencies being varied in a signal of an amplification or source circuit that provides the fixed source impedance. Such an apparatus can further include load circuitry to manifest the variable load impedance, and the source (e.g., voltage generator and/or amplification circuit) which provides the signal, linked to the fixed source impedance. Although not required, the apparatus may further include a reactance-neutralization network, wherein the variable-resistance-matching network and the reactance-neutralization network are cooperatively configured to provide impedance matching, between the amplification or source circuit and the load circuitry. Further, such matching via this circuitry can be realized without relying on operation of adjustable passive components or of semiconductor switches.

Figure 5:
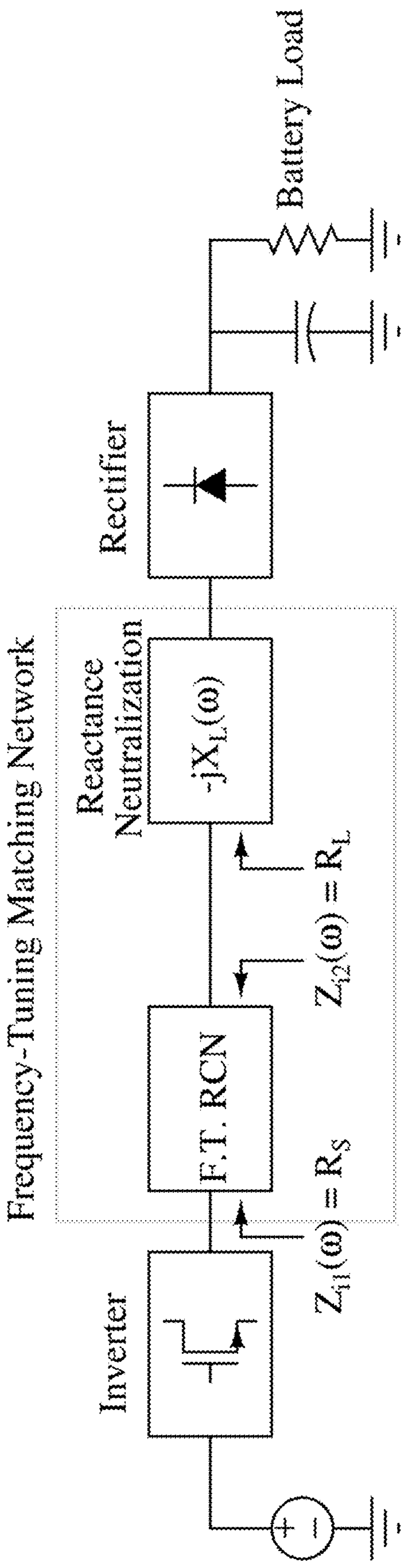
FIG. 5 is an alternative matching network system involving a different fixed-impedance source and a different type of varying load for which matching is realized by a (e.g., or at least one frequency) adjustment, according to certain exemplary aspects of the present disclosure.
Figure 6:
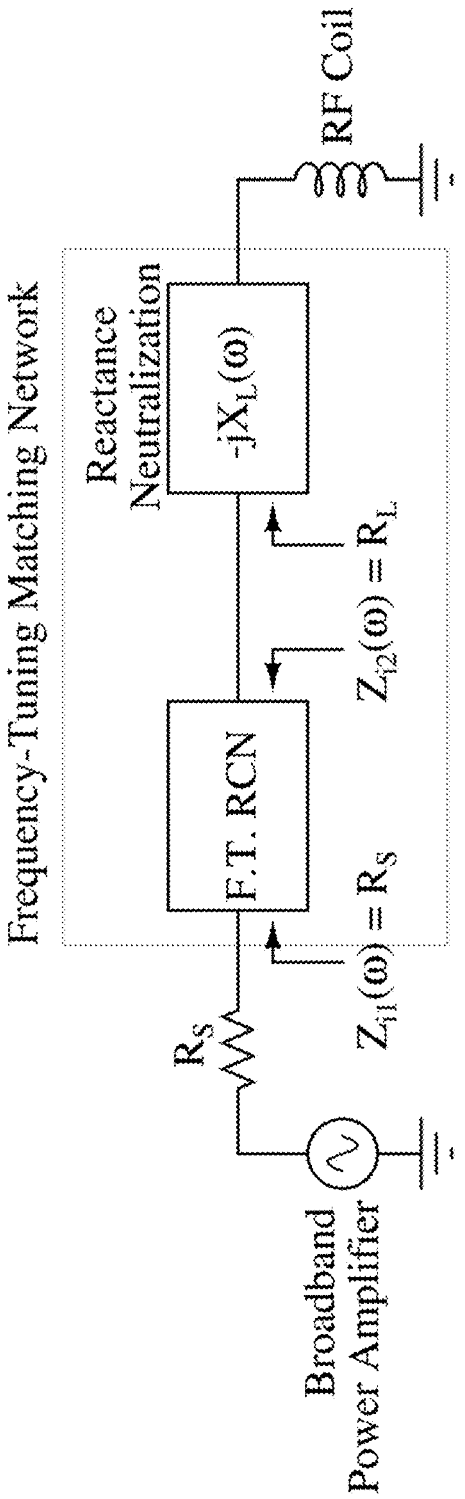
FIG. 6 is an alternative matching network system involving another type of varying load, according to certain exemplary aspects of the present disclosure.
Figure 7:
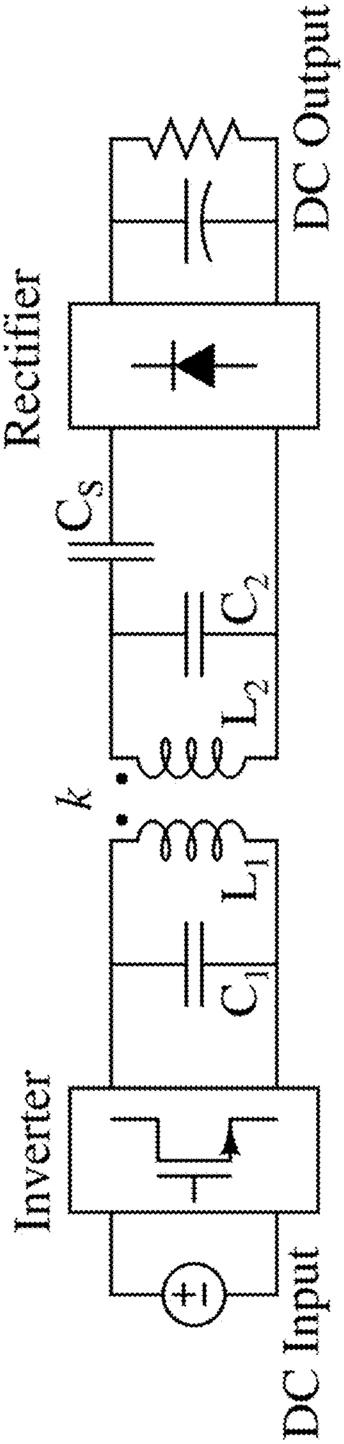
FIG. 7 is yet another alternative matching network system involving an exemplary varying plasma load, according to certain exemplary aspects of the present disclosure.

Different types of circuits can be used than that as disclosed hereinabove (also according to the present disclosure). These circuits include components of the FTMN, front-end (fixed-impedance) circuitry to provide the signal effecting the frequency adjustment, and back-end (varying-load) circuitry. FIGS. 5, 6 and 7 and FIGS. 8A and 8B exemplify such alternative circuits, each according to the present disclosure, which may be used in a variety of different system contexts such as MRI (magnetic-resonance imaging), wireless power transfer (WPT), and EV (electric-vehicle) charging. FIG. 5 is an alternative matching network system involving an inverter as a fixed-impedance source and a battery load as a varying load for which matching is realized by a (e.g., or at least one) frequency adjustment. FIG. 6 is an alternative matching network systems which includes, or is used to drive an RF (radio frequency) coil as a varying load. FIG. 7 is yet another alternative matching network system, according to the present disclosure, involving an exemplary double-tuned resonant topology for driving a load (e.g., plasma load).

Figure 8A:
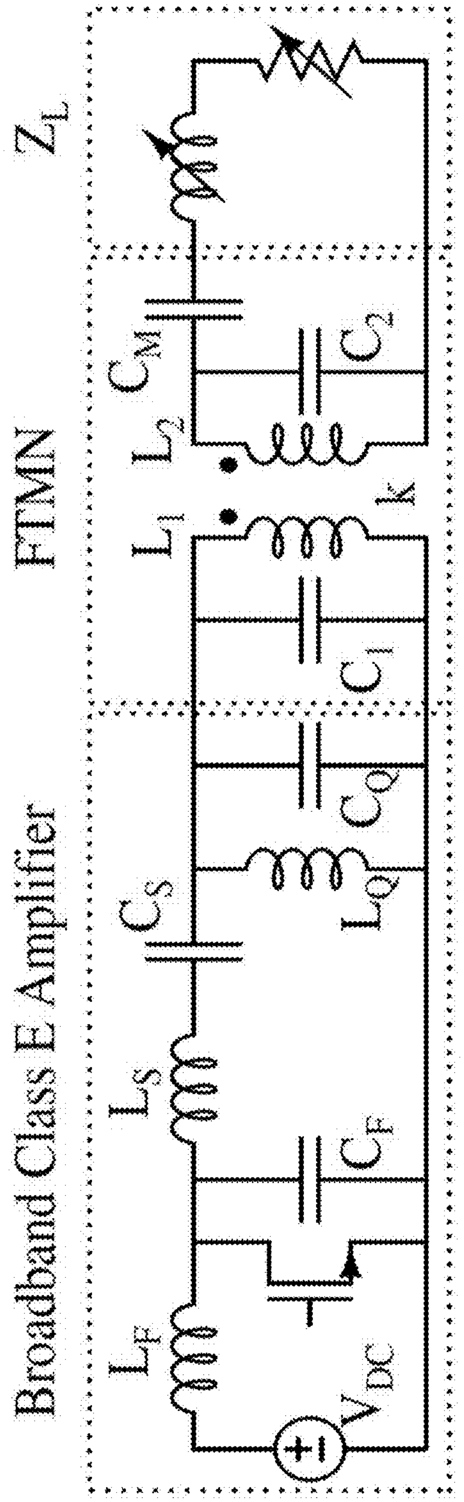
FIGS. 8A and 8B are further alternative matching network systems, according to the present disclosure.
Figure 8B:
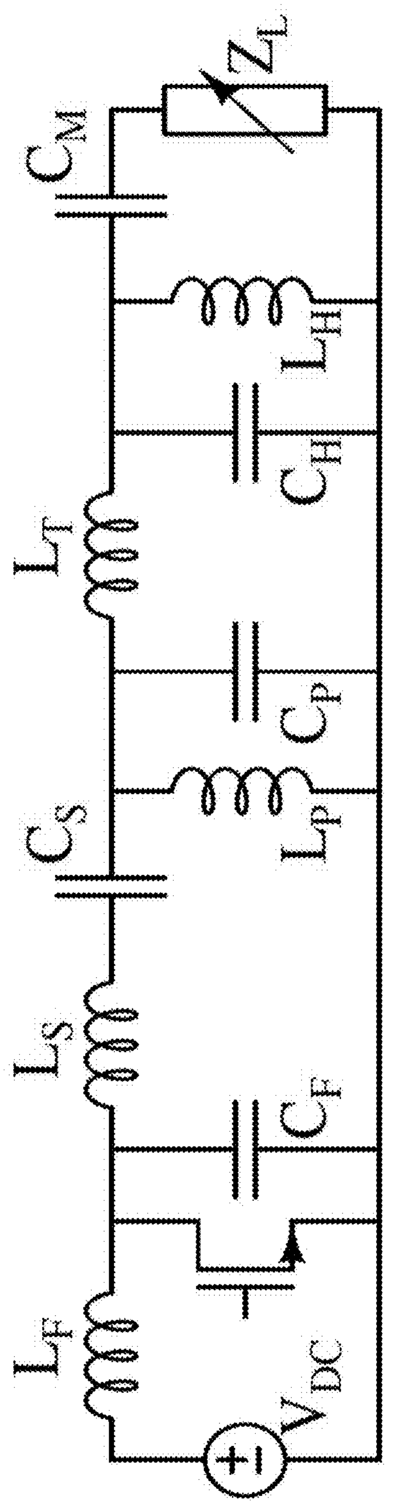

FIGS. 8A and 8B are further alternative matching network systems, useful for showing how the above-exemplified FTMN may be combined with a (broadband) power amplified (PA). More particularly, FIG. 8A is a circuit schematic of the above-exemplified FTMN shown matching a broadband Class E amplifier to a varying load (e.g., to represent the plasma impedance), which is represented as $Z_L$. The circuit shown in FIG. 8A can be further simplified into FIG. 8B by combining the FTMN and the broadband class E amplifier.

A particular example experimental design in this regard, also according to the present disclosure, implements a 13.56 MHz, 450 circuit (as shown in FIG. 8B) with a passive $R_L$ dummy load. The load impedance imitates an inductively coupled 200-800 W CL2 plasma impedance at 30 mT. By converting the coupled inductances in the FTMN into an equivalent T network, the circuit of FIG. 8A is simplified into the circuit of FIG. 8B. The relationship between the component values can be derived mathematically, for example, based on the following relationships: CP=CQ+C1; CH=C2; LT=$(1-k^2/k)\sqrt{L1L2}$; with each of $L_H$ and Lp derived as a function of k, $L_1$ and $L_2$, and Lp further derived as a function of the absolute value of $L_Q$. Based on experimental measurements of the drain waveform at different load conditions, the circuit of FIG. 8B achieves zero-voltage-switching, and the corresponding drain efficiency measurements realize a peak efficiency of approximately 92% and an average efficiency above 90% (in different variations of such circuitry, related peak efficiency and average efficiency are greater than (respectively) 75% and 77%, 80% and 83%, and 85% and 87%). Further and surprisingly, experiment results verify the effectiveness of frequency-adjusted impedance matching with reflection coefficients less than 0.20 and in many instances less than 0.15 (e.g., 0.10-0.12). Accordingly, a PA as implemented in a manner consistent with FIGS. 8A and 8B, can maintain high efficiency while powering a highly-varying load impedance by adjusting the operation frequency (e.g., relying on operation of adjustable passive components or of semiconductor switches).

Also in accordance with aspects of the present disclosure, the appropriate frequency, to which the adjustment (or setting) is effected for the proper matching, may be effected by way of different circuits. In one such example, feedback circuitry is used to select the appropriate frequency to effect the proper matching. In a particular example, feedback circuitry is implemented using a parameter-indicating circuit that senses or measures (e.g., conventional circuitry from which one or more of the above-noted experimentally-directed measurements are made). Further, such feedback circuitry might include: a current sensor indicating an amount of current draw by the load or indicating that the varying load is drawing more than a desired level (threshold) of current for a given impedance) to provide a feedback signal to control the input signal driving the varying load; and a frequency selection circuit (e.g., as a frequency-sweeping signal generator and/or as a frequency-selectable multiplexer) at the front end selection circuit. Also, the feedback signal may indicate or correlate to an optimized matching, or a desired level of matching according to design requirements (e.g., based on previously-calibrated measurements or calculations), and a comparison circuit may be used to generate an output signal that locks the frequency selection circuit to the particular adjusted frequency. In one example, the comparison circuit may be integrated with the parameter-sensing or—measuring circuit and with the comparison circuit including as inputs the feedback signal and a threshold signal or, in the case of an optimization, a steady-state signal sensor indicating that the feedback signal is no longer changing over a specified period of time for a given frequency adjustment.

Consistent with the above aspects, such a manufactured device or method of such manufacture may involve aspects presented and claimed in U.S. Provisional Application Ser. No. 63/521,838 filed on Jun. 19, 2023 (STFD.456P1 S23-224), to which priority is claimed. To the extent permitted, such subject matter is incorporated by reference in its entirety generally and to the extent that further aspects and examples (such as experimental and/more-detailed embodiments) may be useful to supplement and/or clarify. For example, certain of the figures and the equations or expressions numbered one (1) through eight (8) should correspond to the similarly-numbered equations or expressions in U.S. Provisional Application Ser. No. 63/521,838.

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices and examples as described hereinabove may also be found in the above-referenced Provisional Application.

The skilled artisan would also recognize various terminology as used in the present disclosure by way of their plain meaning. As examples, the Specification may describe and/or illustrates aspects useful for implementing the examples by way of various semiconductor materials/circuits which may be illustrated or disclosed as or using terms such as layers, blocks, modules, device, system, unit, controller, and/or other somewhat-general circuit-type depictions. Such circuits, circuit elements (e.g., components) and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:

matching-network circuitry including a variable-resistance-matching network to impedance match a variable load impedance with a fixed source impedance in response to one or more frequencies being varied in a signal of an amplification circuit or source circuit that provides the fixed source impedance by adjusting at least one frequency of a signal derived from an output port of the amplification circuit or source circuit and without relying on operation of an adjustable passive component.

2. The apparatus of claim 1, further including:

load circuitry to manifest the variable load impedance, and the amplification circuit, wherein the signal is from an amplification circuit.

3. The apparatus of claim 1, further including:

load circuitry to manifest the variable load impedance, and a reactance-neutralization network, wherein the variable-resistance-matching network and the reactance-neutralization network are cooperatively configured to provide impedance matching, between the amplification or source circuit and the load circuitry, without relying on operation of semiconductor switches.

4. The apparatus of claim 1, further including a wireless-power-transfer circuit, wherein the amplification circuit or source circuit is part of at least one of: a wireless-power-transfer circuit, a plasma-generator system, and an inverter.

5. The apparatus of claim 1, further including a semiconductor circuit having plasma driven into one or more surfaces or materials associated with or manifestation of the load impedance.

6. The apparatus of claim 1, wherein the variable-resistance-matching network is characterized as being a wide-range resistance-matching network that is variable from a few Ohms up to several Ohms.

7. The apparatus of claim 1, wherein the resistance-matching network is to match different load resistances to source circuit resistances that are within twenty percent of a nominal value Rs, wherein Rs represents resistive source impedance of the amplification circuit.

8. The apparatus of claim 1, wherein the matching is provided through a matching circuit network that does not rely on switching semiconductors characterized as manifesting losses attributable to switching of the switching semiconductors.

9. A method comprising:

matching a varying load impedance associated with a load to a fixed source impedance associated with a source circuit, by adjusting at least one frequency of a signal derived from an output port of the source circuit and without relying on operation of an adjustable passive component.

10. The method of claim 9, further including adjusting the at least one frequency of the signal derived from an output port of the source while using circuitry to counteract or neutralize reactance of the load.

11. The method of claim 9, wherein said matching is performed at least in part via wide-range resistance-matching circuitry that can vary over a wide range, to the fixed source impedance and that is to match a resistance manifested by an interface of a system corresponding to or including MRI (magnetic-resonance imaging) system, wireless power transfer system, and EV (electric-vehicle) charging system.

12. The method of claim 9, wherein said matching is performed at least in part via reactance-neutralization circuitry to neutralize or mitigate reactance associated with the load.

13. The method of claim 9, wherein said matching is performed at least in part via resistance-matching circuitry that is to match a variable resistance, to the fixed source impedance and via reactance-neutralization circuitry, cooperatively configured with the resistance-matching circuitry, to neutralize or mitigate reactance associated with the load.

14. The method of claim 9, wherein the at least one frequency is adjusted, via a frequency-sweep circuit or a frequency-selection circuit, within a range of possible frequencies including lower and upper frequencies and also including a plurality of intermediate frequencies between the lower and upper frequencies.

15. The method of claim 9, wherein the matching is provided through a matching circuit network that does not rely on switching semiconductors characterized as manifesting losses in the switching semiconductors due to non-zero on resistance and switching losses.

16. The method of claim 9, wherein the matching is provided through at least one of: a matching circuit network that includes a frequency-tuning circuit to transform a varying resistance into a near-constant driving point resistance by adjusting the at least one frequency; and feedback circuitry to select an appropriate frequency adjustment to effect the matching.

17. The method of claim 9, wherein the matching is provided through a matching circuit network that includes a reactance neutralization circuit to cause counteracting or neutralizing of reactance manifested by or due to the load.

18. The method of claim 9, wherein the source includes or refers to as a voltage generator, an amplification circuit or an inverter, and the method is carried out by a matching network as part of a system that includes at least one of a wireless-power-transfer circuit and a plasma generator.

19. The method of claim 9, further including transferring power wirelessly, via a wireless-power-transfer circuit, to the load associated with or manifesting the load impedance.

20. The method of claim 9, further including driving plasma, via a plasma generator, to one or more surfaces or materials associated with or manifesting the load impedance, and then forming a semiconductor circuit via the one or more surfaces or materials.

* * * * *